United States Patent
Deeg et al.

(10) Patent No.: US 12,445,020 B2
(45) Date of Patent: Oct. 14, 2025

(54) DRIVE WITH SEGMENTED INVERTER HOUSING

(71) Applicant: Innomotics GmbH, Nuremberg (DE)

(72) Inventors: Christian Deeg, Altdorf (DE); Harald Kuhn, Nuremberg (DE); Johannes Lehner, Fürth (DE); Mischa Maidorn, Stein (DE); Hans Tischmacher, Lauf (DE); Savvas Tsotoulidis, Nuremberg (DE)

(73) Assignee: Innomotics GmbH, Nuremberg (DE)

( * ) Notice: Subject to any disclaimer, the term of this patent is extended or adjusted under 35 U.S.C. 154(b) by 791 days.

(21) Appl. No.: 17/773,788

(22) PCT Filed: Nov. 4, 2020

(86) PCT No.: PCT/EP2020/080958
§ 371 (c)(1),
(2) Date: May 2, 2022

(87) PCT Pub. No.: WO2021/099121
PCT Pub. Date: May 27, 2021

(65) Prior Publication Data
US 2022/0393557 A1    Dec. 8, 2022

(30) Foreign Application Priority Data

Nov. 22, 2019  (EP) .................................... 19210995

(51) Int. Cl.
*H02K 11/33*   (2016.01)
*H02K 9/06*    (2006.01)
*H05K 1/14*    (2006.01)

(52) U.S. Cl.
CPC ............... *H02K 11/33* (2016.01); *H02K 9/06* (2013.01); *H05K 1/147* (2013.01)

(58) Field of Classification Search
CPC .................................................. H02K 2203/03
(Continued)

(56) References Cited

U.S. PATENT DOCUMENTS 5,049,769 A    9/1991   Reinhardt et al.
5,159,751 A    11/1992  Cottingham et al.
(Continued)

FOREIGN PATENT DOCUMENTS

CN    202127321 U    1/2012
CN    103004059 A    3/2013
(Continued)

OTHER PUBLICATIONS

CN-109788641-A machine translation (Year: 2019).*
(Continued)

*Primary Examiner* — Oluseye Iwarere
*Assistant Examiner* — Minki Chang
(74) *Attorney, Agent, or Firm* — Henry M. Feiereisen, LLC

(57) ABSTRACT

In a method of producing an add-on part of a drive, one circuit board of multiple planar circuit boards, which have electrical conductor tracks with electrical connections, is provided with a centrally arranged opening for passage of a shaft. The circuit boards are populated with electrical and/or electronic components, and the populated electrical and/or electronic components and wiring are electrically tested. Segments made of a material with high thermal conductivity are arranged on at least two of the multiple circuit boards such that a bending process in a region of the electrical connections between the at least two circuit boards causes the segments to form an approximately peripherally closed cover. Lids are arranged on open sides of the cover to realize a closed housing arrangement.

16 Claims, 5 Drawing Sheets

(58) Field of Classification Search
USPC .............................................. 310/68 R–68 E
See application file for complete search history.

(56) References Cited

U.S. PATENT DOCUMENTS

| 5,179,501 | A | 1/1993 | Ocken et al. |
| 5,434,362 | A | 7/1995 | Klosowiak et al. |
| 5,998,738 | A | 12/1999 | Li et al. |
| 6,270,320 | B1 | 8/2001 | Heyder et al. |
| 2005/0041399 | A1 | 2/2005 | Youker et al. |
| 2005/0190531 | A1 | 9/2005 | Gall et al. |
| 2007/0212902 | A1 | 9/2007 | Clayton et al. |
| 2012/0063187 | A1 | 3/2012 | Sato et al. |
| 2016/0146897 | A1 | 5/2016 | Teng et al. |
| 2016/0276895 | A1* | 9/2016 | Aizawa .................... H02K 3/46 |
| 2018/0123430 | A1 | 5/2018 | Wettlaufer et al. |
| 2018/0177080 | A1 | 6/2018 | Kitao et al. |
| 2019/0190361 | A1 | 6/2019 | Gregorich et al. |

FOREIGN PATENT DOCUMENTS

| CN | 103004079 A | 3/2013 | |
| CN | 105652205 B | 9/2018 | |
| CN | 109788641 A * | 5/2019 | ........... B62D 5/0403 |
| DE | 38 42 588 A1 | 6/1990 | |
| DE | 39 36 906 A1 | 5/1991 | |
| DE | 198 12 729 A1 | 9/1999 | |
| EP | 0 557 883 A1 | 9/1993 | |
| EP | 0 827 372 A2 | 3/1998 | |
| EP | 1 271 749 A1 | 1/2003 | |
| EP | 2 348 799 A1 | 7/2011 | |
| JP | H10248198 A | 9/1998 | |
| WO | WO 93-11654 A1 | 3/1993 | |
| WO | WO 2016-188756 A1 | 12/2016 | |

OTHER PUBLICATIONS

PCT International Search Report and Written Opinion of International Searching Authority mailed Jan. 22, 2021 corresponding to PCT International Application No. PCT/EP2020/080958 filed Apr. 11, 2020.

Chinese Search Report issued on Mar. 5, 2025 with respect to counterpart Chinese patent application 202080080512.7.

Translation of Chinese Search Report issued on Mar. 5, 2025 with respect to counterpart Chinese patent application 202080080512.7.

* cited by examiner

DRIVE WITH SEGMENTED INVERTER HOUSING

CROSS-REFERENCES TO RELATED APPLICATIONS

This application is the U.S. National Stage of International Application No. PCT/EP2020/080958, filed Nov. 4, 2020, which designated the United States and has been published as International Publication No. WO 2021/099121 A1 and which claims the priority of European Patent Application, Serial No. 19210995.7, filed Nov. 22, 2019, pursuant to 35 U.S.C. 119 (a)-(d).

BACKGROUND OF THE INVENTION

The invention relates to an electronic add-on part, a drive unit with a dynamoelectric machine and at least one electronic add-on part as well as the production of the electronic add-on part.

A drive system with variable rotational speeds comprises a motor and an inverter which form a common unit.

Such drive units are known, for example, from DE 198 12 729 A1. An electric motor is described there, in particular with a fan propeller to form an axial or radial fan, with a drive unit and a control unit having a control housing, wherein the drive unit has a stator, a rotor and at least one electric coil and wherein the control unit has an electronic circuit for controlling or regulating the current supply to the coil. The drive unit and the control unit are formed by modules, and contact elements assigned to one another are provided for mutual electrical connection.

Likewise, a drive unit is known from DE 38 42 588 A1. A collector-free direct current external rotor motor is described there, comprising a stator which is attached to a motor flange with stator windings, an external rotor which surrounds the stator on its side facing away from the motor flange, and an electronic circuit arrangement which controls the stator windings. This circuit arrangement has a printed circuit board which is arranged on the flange side facing toward the stator and has electronic components, as well as a plurality of power semiconductors which are electrically connected to the printed circuit board and are arranged in thermally conductive contact with the motor flange. The power semiconductors are indirectly connected in a thermally conductive manner to the motor flange via a heat sink in the form of an annular disk. The heat sink forms a pre-assembled assembly with the printed circuit board and a support element holding the printed circuit board.

The production of these drive systems, consisting of a motor and an inverter, includes inter alia, the populating of a printed circuit board with power electronics, as well as their placement and the placement of further power electronics in an aluminum cast housing. The circuit board does not provide sufficient installation space to mount the complete power electronics thereon. Therefore, the power electronics must be partially mounted on the inside of the cast housing.

The cast housing functions inter alia as a heat sink. In order to ensure good heat dissipation from the cast housing, a corresponding flatness, surface roughness and thermal connection to the respective power electronics must be provided. Due to the die casting process, however, reworking is required here to ensure the required dimensions, shape tolerances and surface roughness as these cannot be guaranteed by cavities or shrinkage during cooling. Furthermore, many threaded bores are required for fastening the covers, the circuit board, the cable inlet, and the power electronics. Some of these threaded bores lead to comparatively complex processing as they are located on the inside of the cast housing and thus form an undercut.

This also leads to complex and confusing cable laying within the cast housing, which also results in a high level of manual effort in a very confined space.

Automated production and automated testing, in particular of the service components, is thus virtually impossible.

Based on this, the object of the invention is to provide a compact electronic add-on part and a compact drive unit which ensures sufficient cooling of the drive unit and can be produced with little effort.

SUMMARY OF THE INVENTION

The object set is achieved by the production of an electronic add-on part of a drive with actuator and/or inverter components by means of the following steps:
providing an in particular planar arrangement of multiple circuit boards with electrical conductor tracks respectively provided thereon, which have electrical connections,
populating the circuit boards of planar configuration with the electrical and/or electronic components provided for them,
electrically testing the populated components and wiring, etc.,
arranging segments on at least two circuit boards such that, as a result of a bending process in the region of the electrical connections between the circuit boards, the segments form an approximately peripherally closed cover,
arranging lids on the open sides of the cover in order to thus realize a closed housing arrangement (38).

These production steps can be carried out at least partially in succession and/or at the same time.

The object is also achieved by an electronic add-on part with actuator or inverter components which are arranged on circuit boards, the circuit boards being arranged in a star-shaped manner, a central circuit board and peripheral boards surrounding it having peripheral boards which are electrically conductively connected at least to that of the central circuit board,
a peripheral cover being composed of at least two segments, each segment being in direct thermally conductive contact with at least one peripheral board,
the central circuit board having a centrally arranged recess, at least one peripheral board being arranged bent at a predetermined angle with respect to the central circuit board on a bending section.

The object set is also achieved by means of a drive with at least one dynamoelectric rotary machine,
at least one electronic add-on part,
at least one cooling unit,
wherein these components of the drive are arranged axially one behind the other such that the electronic add-on part is arranged axially between the dynamoelectric rotary machine and the cooling unit
wherein the electronic add-on part is cooled by a cooling air flow.

The entire circuit board according to the invention is composed of a plurality of, in particular, continuous partial boards, in particular a central circuit board and its peripheral boards. The peripheral boards are connected to the central circuit board via a flexible, electrically conductive construction, in particular rigid-flex connections. After the central and individual peripheral boards have been populated, these connections can be bent by a defined angle at the predetermined points. This bending process can also be carried out without tools.

Thus, the complete power electronics can be mounted on the individual circuit boards in one populating process. It is therefore not necessary to manually mount further power electronics in a housing. By using the rigid-flex connection, the available installation space in the housing can be put to optimum use.

According to the invention, the housing arrangement of the electronic add-on part is no longer designed as a cast housing. It is divided into a plurality of preferably similar segments which can be produced by means of extrusion processes.

The segments are made of a material with comparatively high thermal conductivity, such as aluminum or an aluminum alloy.

This results in a cost advantage due to the elimination of the expensive die casting mold as opposed to the extrusion die.

In contrast to a cast housing, the dimensional accuracy, the flatness, and the surface roughness of the extruded profile do not require any further processing. Furthermore, the production of the fastening bores for the peripheral boards can be realized more easily as there is no undercut in this design. The bores for fastening a lid are integrated into the extrusion die and therefore no longer have to be drilled. The extruded profile also has better thermal conductivity in contrast to the die-cast housing as the latter has a more uniform and cavity-free structure.

The degree of automation for the production of the electronic add-on part and thus of the drive is significantly increased as a result. The populating of the entire circuit board, which is composed of the central circuit board and the peripheral boards with the respective power electronics, can be carried out in a fully automated manner. The subsequent testing of the entire circuit board can also take place in a fully automated manner as this is advantageously carried out in one plane.

The power electronics of the actuator and/or inverters, and the electrical and electronic components in the electronic add-on part are understood to mean the electronics necessary for a drive or a dynamoelectric machine, which can have one or more of the components listed by way of example. Driver electronics with power supply, monitoring modules for voltage, current or thermal state, power semiconductors (IGBT, triacs, thyristors, etc.), integrated protective functions (overcurrent, undervoltage, short circuit, etc.), brake chopper, etc.

The power electronics provided on the circuit boards are contacted, for example, via a plug connection, soldered connections, etc. These power electronics are firmly connected to the associated segment or segments before, after or during contact with the peripheral board. This connection has good thermal conductivity, which is supported by the choice of materials, as well as by possible thermal compounds.

By bending or buckling the peripheral boards relative to the central circuit board, preferably by 90°, the individual segments can now be connected by means of connectors. Thus, a closed circumferential surface—the cover—is created. The peripheral boards, which are arranged essentially tangentially, are located on the inside of the cover. At least one side of the peripheral boards is electrically connected to the central circuit board. The central circuit board is essentially perpendicular to an axis of the drive.

In connection with an upper and lower lid and the cover, a closed housing arrangement of the electronic add-on part is created. Due to the electrically conductive connection between the central circuit board and the peripheral boards, no further routing of cables is required in the interior of the housing arrangement.

As a result of the use of a central and peripheral board, the complete power electronics can be populated and tested in an automated manner on the respective circuit boards. This leads to higher productivity and a significant reduction in assembly costs.

No further processing steps are required on the cover or on the segments to achieve the required dimensional accuracy, flatness, and surface roughness as these can be produced by means of extrusion methods.

The cover or the segments are made of a material with comparatively high thermal conductivity, such as aluminum or an aluminum alloy.

In this way, simpler and more cost-effective production, inter alia of the thermal connection of the power electronics to the segment, is implemented. Only the threaded bores for fastening the power electronics and the cable guide must still be produced. The bores for fastening the covers are already integrated into the extruded profile.

Furthermore, each individual segment has better coding properties through the use of the extrusion manufacturing process as opposed to a die casting process. Moreover, the expensive die casting mold can be replaced by a considerably more favorable extrusion die.

This results in a very compact and efficient drive, the components of which, in particular the electronic add-on part as well as the dynamoelectric rotary machine, can be sufficiently cooled.

Via the cover of the electronic add-on part, its elements, such as power semiconductors, control and regulating units, are cooled. In the case of the dynamoelectric rotary machine, the stator and the rotor are cooled in particular via a shaft and the cooling air flow guided along a housing of the dynamoelectric rotary machine.

The entire cover formed by segments is essentially tubular. The housing of the electronic add-on part is created by lids to be attached on both sides. Depending on the drive system, the lids have central openings—just like the central circuit board. These axial openings are sealed to the shaft by a tube in a contactless manner. Through these openings, the shaft, which inter alia is the drive shaft of the cooling unit, in particular of a fan, now projects in a contactless manner. Thus, for example, suitable self-ventilation of the drive is now possible.

The cover or the segments have axial and radially extending ribs on their outer side. The inside of the segments is preferably designed to be flat in order to connect actuator or inverter components directly to the inside of the segment in a thermally effective manner.

The rotor of a dynamoelectric machine is also cooled, inter alia, via the shaft. Moreover, heat from the rotor is also emitted to the interior of the dynamoelectric rotary machine so that the bearing shields, bearings, and housing may likewise heat up as a result. This heat input is discharged through the air flowing around the housing and the bearing shields, in particular through the adaptable cooling unit, for example, the fan.

The stator also generates heat which, inter alia, heats up the interior of the dynamoelectric rotary machine. This heat input is likewise discharged through the air flowing around the housing and the bearing shields. Furthermore, the stator is preferably shrunk into a jacket of the housing in order to obtain a comparatively good heat transfer from the laminated core of the stator to the housing and the housing ribs.

During operation of the dynamoelectric rotary machine, the cooling unit, which is designed in particular as an internal fan, generates a cooling air flow which is first guided radially along the housing of the electronic add-on part. A fan cowl, which extends axially in the direction of the AS bearing, also guides the cooling air flow along the cooling fins of the cover and housing of the dynamoelectric rotary machine.

BRIEF DESCRIPTION OF THE DRAWING

The invention end further advantageous embodiments of the invention are explained in more detail with reference to basic representations of exemplary embodiments. In the diagrams.

DETAILED DESCRIPTION OF PREFERRED EMBODIMENTS

Figure 1:
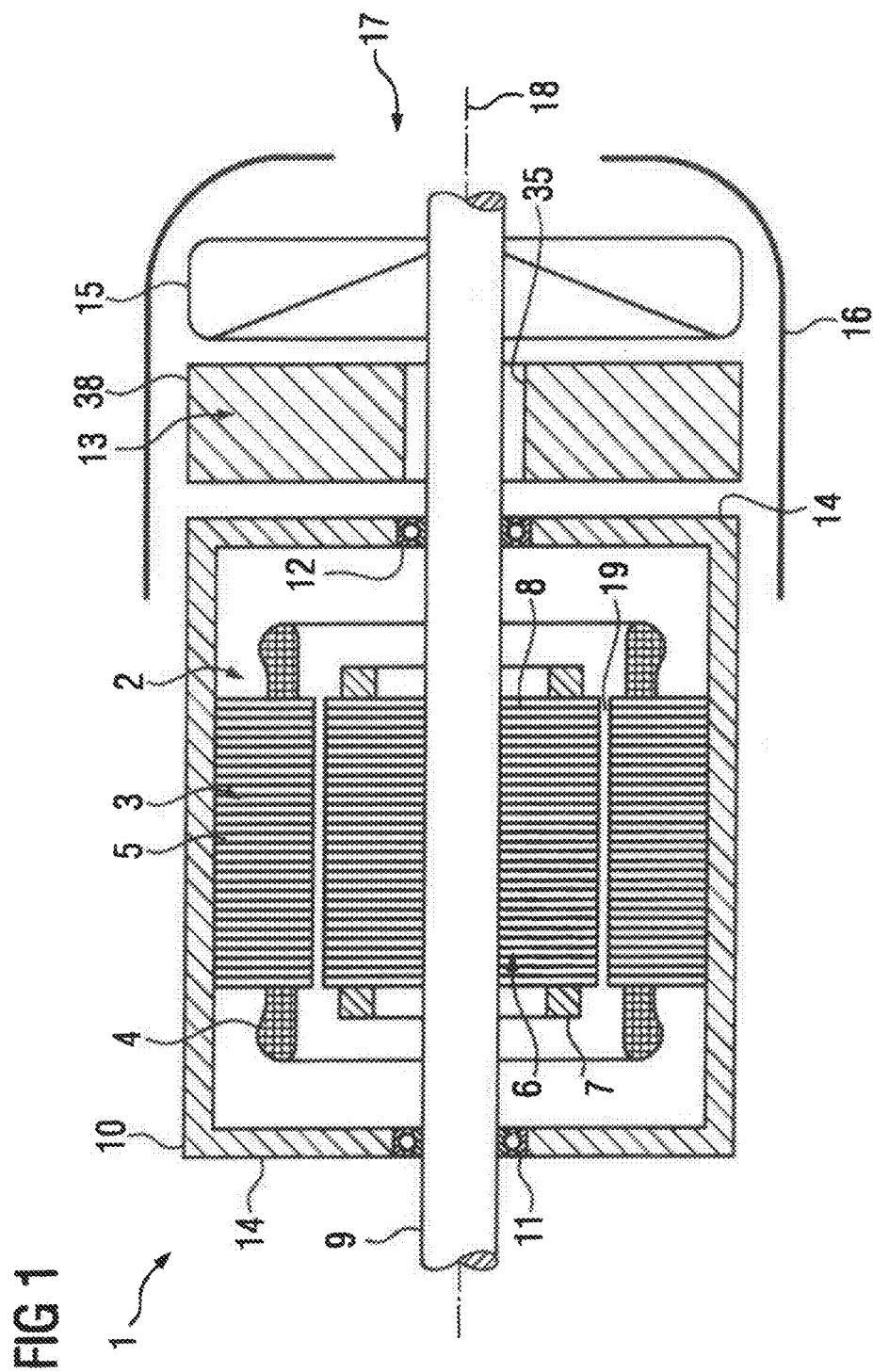
FIG. 1 shows a basic longitudinal section of a drive according to the invention.

FIG. 1 shows, In a basic longitudinal section, a drive 1 with a dynamoelectric rotary machine 2 which has a stator 3 with a laminated core 5. A winding system which forms winding heads 4 on the end faces of the laminated core 5 of the stator 3 is arranged in the laminated core 5 of the stator 3, facing an air gap 19. Non-rotatably connected to a shaft 9 is a laminated core 8 of a rotor 6, which laminated core 8 interacts electromagnetically with an energized winding system of the stator 3 and thus leads to a rotation of the shaft 9 about an axis 18. The shaft 9 is held in two bearings, an AS bearing 11 and a BS bearing 12.

The dynamoelectric rotary machine 2 is surrounded by a housing 10 which is bounded at the end faces by bearing shields 14. An electronic add-on part 13 which contains at least elements of an inverter and/or an actuator is located at an axial distance from the BS bearing side. The electronic add-on part 13 is stationary and is not connected to the shaft in a rotationally fixed manner. Axially adjoining this is a fan 15 which in turn is connected in a rotationally fixed manner to the shaft 9 and generates a cooling air flow which is guided through a fan cowl 16. The air flow is supplied to the fan 15 via a suction opening 17.

In the case of the drive 1, heat build-up occurs during operation of the drive 1, in particular between the electronic add-on part 13 and the facing bearing plate 14. Heat input takes place from both axial sides. Thus, heat loss from the inverter and/or actuator, that is to say the electronic add-on part 13, as well as heat from the machine 2 leads via the bearing plate to this heat build-up between the individual components. The heat from the machine 2 is composed, inter alia, of the heat loss from the stator 3 and the rotor 6. These also heat the adjacent bearings 11, 12, which impairs the lubricant of the bearings and would require shorter lubrication intervals.

The heat is also transported via the shaft 9, in particular from the rotor 6 of the dynamoelectric rotary machine 2, and supplied to the fan 15 which functions, inter alia, as a heat output element. During operation of the dynamoelectric rotary machine 2, the fan 15 also generates a cooling air flow.

The electronic add-on part 13 is spaced apart from the shaft 9 and fixed in a stationary manner via mechanical connections to the adjacent bearing plate and/or to a fan cowl 16.

Electrical connections and/or data lines between the electronic add-on part 13 and the dynamoelectric machine 2 are possible via the lid 36 and an opening in the opposite bearing plate 14.

Lines can likewise be guided via a connection element 32 into a terminal box 37 of the dynamoelectric machine 2.

These connections are all made in compliance with the respective predetermined degree of protection via the bearing plate 14 and/or the housing 10 and/or a terminal box 37 on the housing 10.

Figure 2:
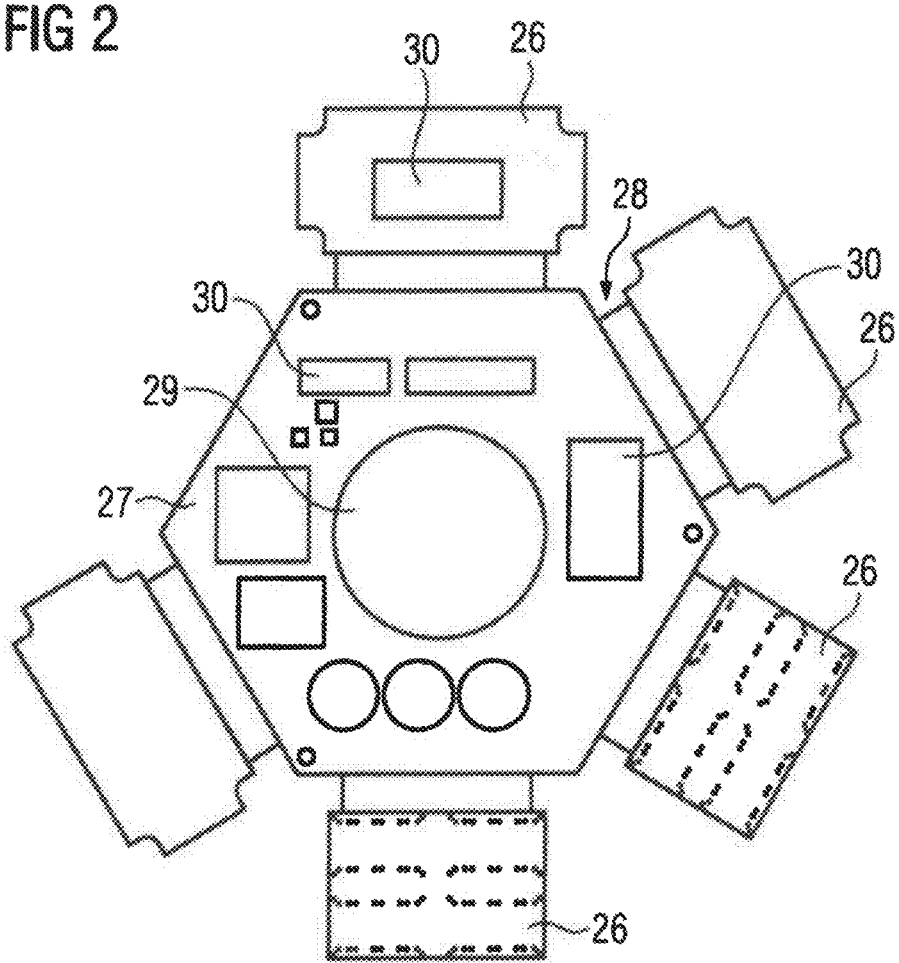
FIG. 2 shows an entire circuit board with central and peripheral boards.

FIG. 2 shows an exemplary arrangement of an entire circuit board with a central circuit board 27 and peripheral boards 26 in one plane. A number of power modules which are electrically contacted via rigid-flex connections in the bending sections 28 to the power modules arranged on the peripheral boards 26 are arranged on the central circuit board 27. In this example, the central circuit board 27 has a hexagonal basic shape, one side being free of the peripheral board 26 in order to enable connection options there, for example to a motor and/or terminal box 37. Other basic shapes are also possible for the central circuit board 27, such as triangular, rectangular, octagonal, or dodecagonal.

The bending lines of the bending sections 28 run parallel to the respective outer edge of the selected basic shape.

Of course, oblique bending lines are also conceivable, this depends inter alia on the basic shape selected and the angle thereof.

Figure 3:
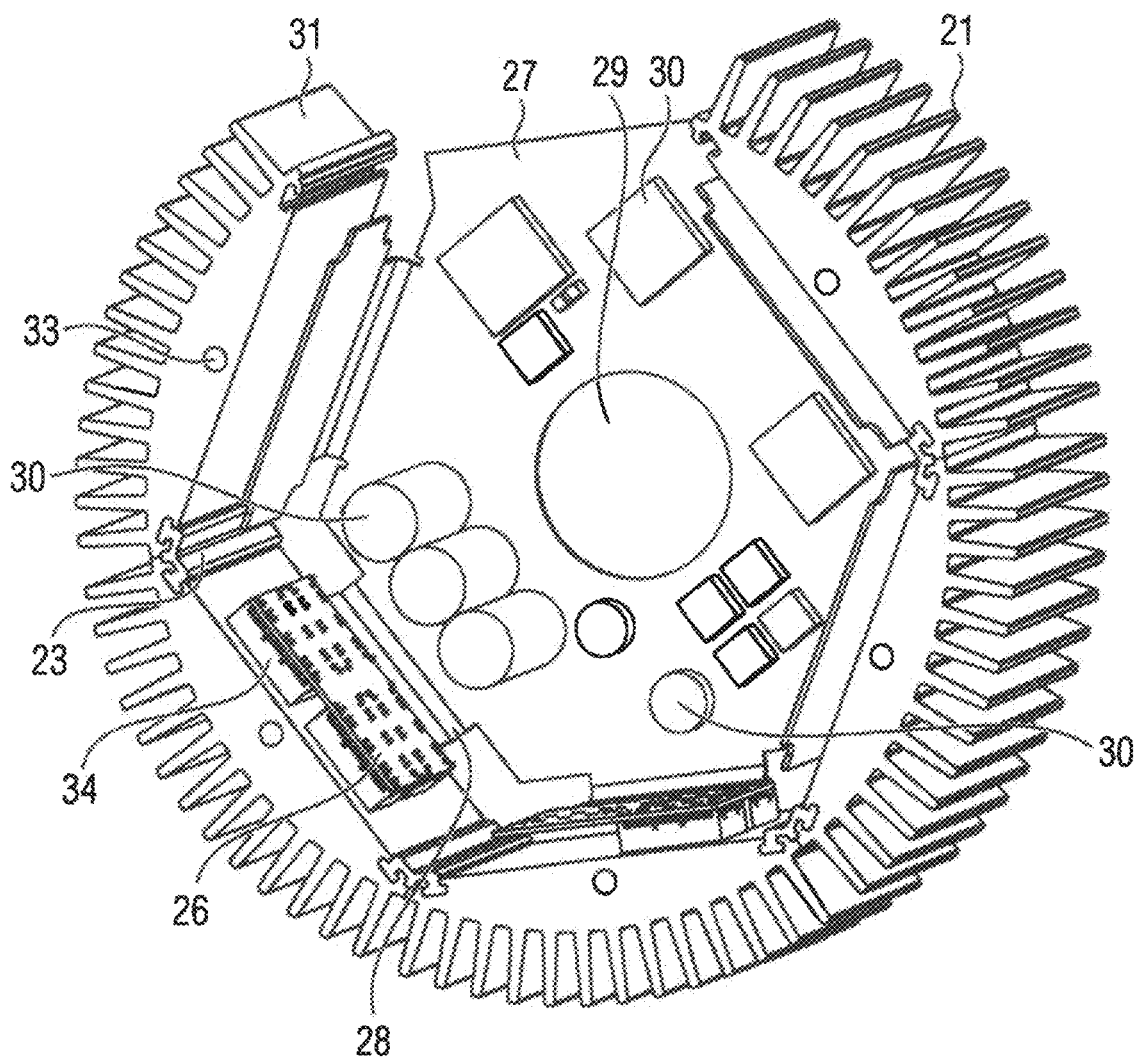
FIG. 3 shows a circuit board arrangement with segments.

FIG. 3 shows the bent peripheral boards 26 and their thermal contact with the respective segments 31. The peripheral boards 26 are bent at a predetermined angle, in particular 90 degrees, with respect to the central circuit board 27 on the bending section 28.

The peripheral boards 26 are thermally connected as directly as possible to the segments 31.

Thus, the peripheral board 26 has a thermally conductive connection 34 at least to its respective segment 31. The segments 31 have bores 33 in order to attach the lid 36 (not shown in this illustration). The individual segments 31 are mechanically connected to one another by connectors 23 (connecting elements such as screws, snap connections, etc.) and thus form a peripherally closed cover 20. In addition to mechanical fixation, the connectors optionally also represent a thermally conductive connection in order to achieve equalization of the temperature of the electronic add-on part 13 via the cover 20.

The cover 20 and thus also the segments 31 are made of a material with high thermal conductivity, so that the heat loss of the actuators and/or inverter components from the electronic add-on part 13, caused inter alia by the components 30 and/or the power modules, can be emitted to the cooling air flow. Additional fins 21 on the segments 31 increase the heat dissipation effect, in particular when, as shown in FIG. 1, a fan cowl 16 conducts the cooling air flow.

Figure 4:
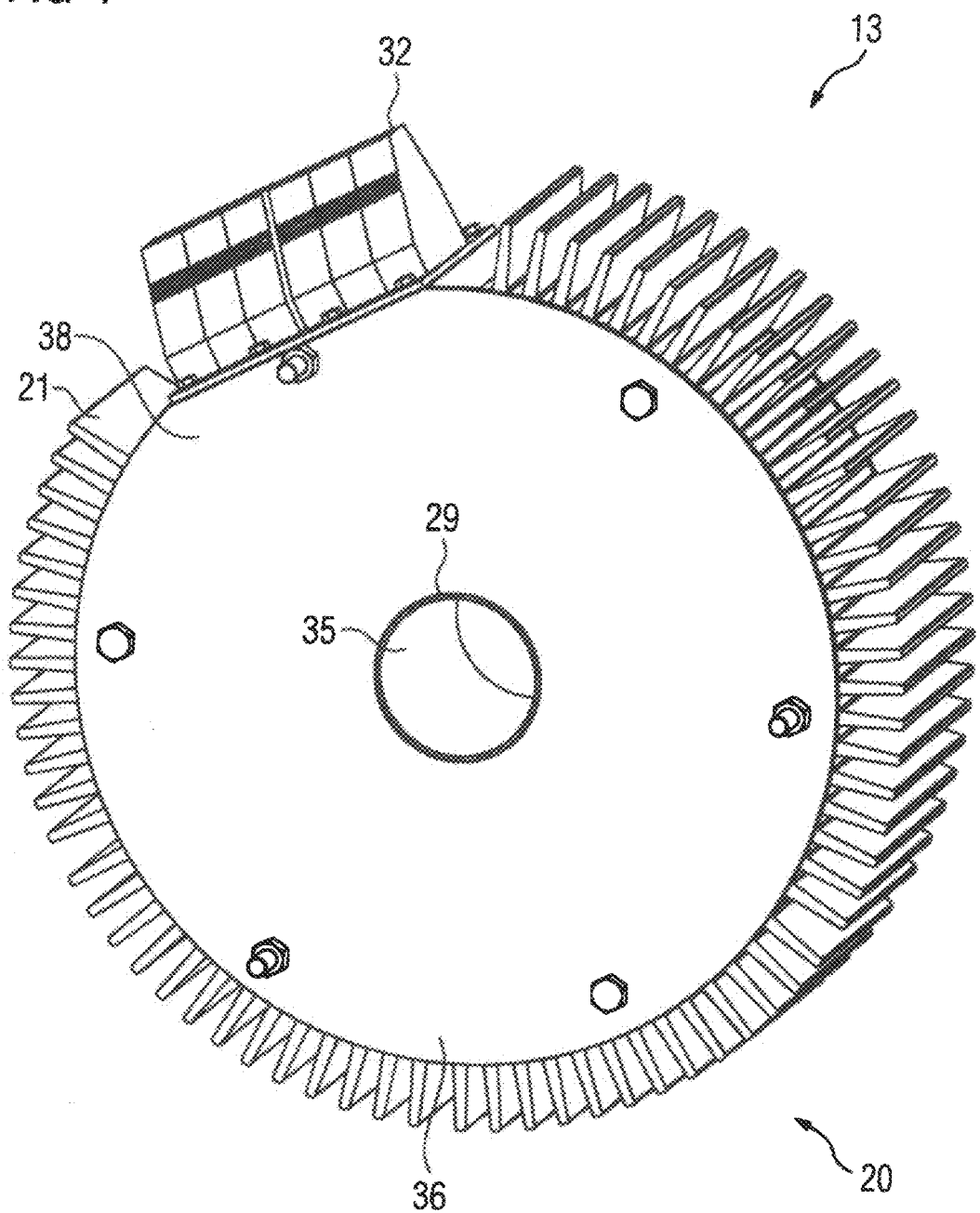
FIG. 4 shows an electronic add-on part.

FIG. 4 shows a dosed electronic add-on part 13, the housing arrangement 38 of which is formed by an essentially cylindrical cover 20, and two lids 36. A tube 35 is provided between the lids 36 in the region of the opening 29 of the central circuit board 27 in order to allow the passage of the shaft. This enables self-ventilation of the drive 1 as the shaft 9 can drive a fan 15 directly. The shaft 9 has no contact with the tube 35 in order, inter alia, to prevent heat transfer into the electronic add-on part 13.

Instead or in addition, an external fan can also be provided.

A connection element 32 is provided in the region of the "missing" peripheral board 26 in order to ensure an electrical supply of the drive 1. If all sides of the central circuit board 27 are provided with peripheral boards 26, an electrical supply can also take place via a lid 36.

Advantageously, the fins 21 and the fins of the housing 10 of the dynamoelectric rotary machine 2 are axially aligned in order to thus offer the least possible flow resistance to the cooling air flow.

By means of the cover 20 and by means of the corresponding embodiment of the lid 36, the electronic add-on part 13 can also comply with higher protection classes.

Furthermore, the cover 20 also serves as a heat buffer for fluctuating operating states of the drive 1, for example, brief overload.

Figure 5:
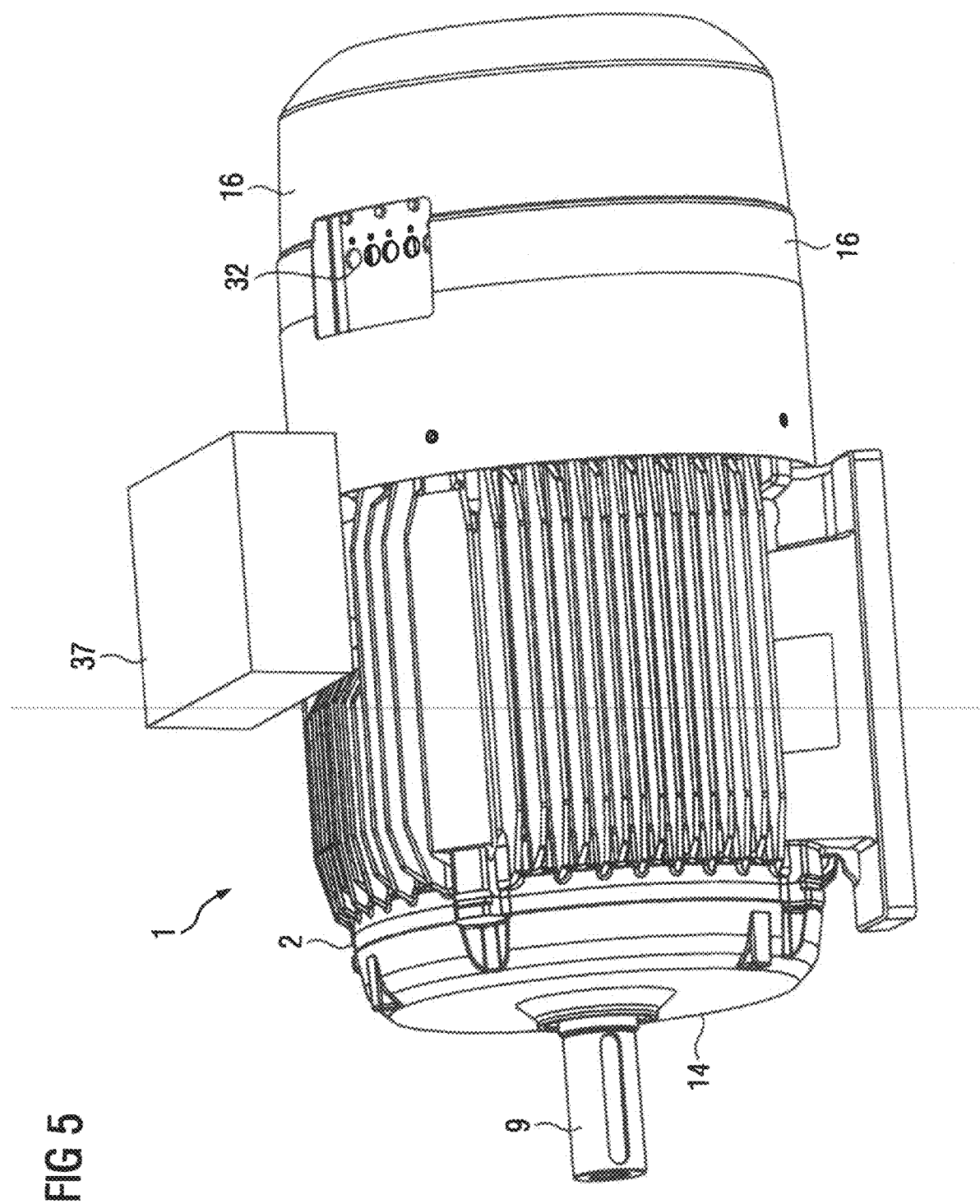
FIG. 5 shows a perspective representation of a drive.

According to FIG. 5, which shows a simplified drive 1, the fan cowl 16 can also have a passage 22 for contacting the electronic add-on part 13. Furthermore, the fan cowl 16 can also be divided axially into two parts in order to facilitate service work on the fan 15 and/or electronic add-on part 13.

The drive 1 or the drive unit is basically of compact design. In this case, the features described above, and the following features can be applied and assembled individually or in any desired combination for the design of the drive 1. In this case, the compact drive 1 is, inter alia, to be cooled in the best possible way.

For this purpose, at least one electronic add-on part 13 or components thereof, such as one or more power semiconductors, chokes, capacitors, and control modules, is provided axially on the dynamoelectric rotary machine 2. These components of the electronic add-on part 13 are arranged in a closed housing arrangement of the electronic add-on part 13 which is formed in sections by the cover 20.

The drive 1 and its respective sections/parts/components are cooled by means of one or more cooling units, which cooling can be realized as liquid cooling (cooling jacket on housing arrangement 38 and/or on the housing 10 of the dynamoelectric rotary machine 2). Preferably, air cooling is provided, the fan 15 of which is located on the side of the dynamoelectric rotary machine 2 facing away from the housing arrangement, so that that there is an axial sequence of fans 15, housing arrangement of the electronic add-on part 13 and dynamoelectric rotary machine 2.

The fan 15 can also be constructed as a fan unit comprising one or more internal and/or also external fans, which can also be at least partially integrated on or in a fan cowl 16.

To improve the cooling effect, surface-enlarging measures are provided on the housing arrangement 38 and/or the housing 10 of the dynamoelectric rotary machine 2. In this case, fins 21, knobs or additional heat capacity in the form of housing extension are provided there, which can buffer thermal loads during the corresponding operation of the drive 1.

In addition, by means of a special design or recesses between the dynamoelectric rotary machine 2, in particular the bearing plate 14 thereof and the housing arrangement 38, cooling channels are created which, as a result of a corresponding design and a main air flow, achieve a Venturi effect in the recesses which contributes to cooling.

The housing arrangement 38 can also be funnel-shaped, wherein the funnel has a cylindrical section and an axial tapering section which can be made in one piece from the same material, from a plurality of parts with different materials and from a plurality of parts with the same material. The cover 20 then forms part of the funnel which tapers in the direction of the fan 15.

In order to increase the surface of the housing arrangement 38, in particular of the cover 20, the cylindrical section and/or the axially tapering section has axially or quasi-radially extending fins on its outer side.

In order to obtain a funnel-shaped construction of the cover 20, other bending angles may be provided between the peripheral board 26 and the central circuit board 27.

The inside of the cylindrical section and/or the axially tapering section is polygonal in order to be able to arrange actuator and/or inverter components directly on the inside of the housing arrangement 38. A comparatively good thermal connection is thus ensured.

The actuator or inverter components can in particular also be arranged in the cylindrical section, in this case the axially tapering section acts as heat capacity, which has a thermally buffering effect. This section is then designed as a solid material which simultaneously fulfills the function of a cover disk for the fan 15. Axially shorter fans 15 can thus be used in order to obtain a more compact drive design.

It is likewise possible to provide one or more internal fans in the electronic add-on part 13 which lead to an internal cooling circuit within the closed electronic add-on part 13. The internal fan can either be controlled separately as an external fan as a function of temperature, or is magnetically coupled to the shaft 9, so that there is a kind of self-ventilation of the electronic add-on part 13 as soon as the shaft 9 rotates.

The internal fan is driven via a magnetic coupling of magnets positioned on the shaft 9 and magnets arranged accordingly within the electronic add-on part 13, for example on a hub of the internal fan.

Alternatively, the internal fan can also draw its drive energy from the rotating field of the dynamoelectric rotary machine 2, in particular its harmonics.

The electric drive energy of the internal fan can also be taken directly from the actuator or inverter components within the electronic add-on part 13.

In each embodiment, these internal fans are rotatably mounted inside the stationary add-on part 13.

The actual temperature is determined in each case via a temperature model and/or one or more temperature sensors in the dynamoelectric rotary machine 2 and/or the electronic add-on part 13.

Redundancy operation of the drive 1 can also be maintained at least temporarily by the fan 15 and the internal fan, if one of the two fans should fail.

For regulation, the drive 1 may also have a regulating unit which receives data from a wide variety of sensors, inter alia temperature sensors, vibration sensors, and acoustic sensors. In this drive 1, the temperature sensors are arranged at the relevant installation locations. Thus, temperature sensors are provided for the outside air, for the electronic add-on part 13, the power semiconductor in the electronic add-on part 13, for the bearing or bearings 11, 12, for the winding system and/or the winding head 4, for the interior of the machine 2, as well as for the housing 10 and the environment.

Sensors which are provided in the drive 1, that is to say, the machine 2 and/or the electronic add-on part 13, are connected in a wired or wireless manner to a regulating unit which is arranged in the electronic add-on part 13 or on the housing 10 of the machine 2, in particular in a terminal box or in the machine 2.

Vibration sensors are mounted on the shaft 9, and/or bearings and/or bearing plate and/or housing 10. Acoustic sensors are provided above all on sound-emitting sources such as, for example, fins or bearing shields 14. Furthermore, rotational speed sensors are provided for regulating the drive 1.

From all this data, the regulating unit regulates or controls, inter alia, the rotational speed of the external fan or the external fans and/or the clock frequency of the inverter. That is to say, at particularly high external temperatures and/or low rotational speed of the shaft 9, the external fan is switched on as a function of temperature. In this case, the rotational speed and thus the volume flow of the external fan 26 can also be controlled or regulated.

The actual temperature, preferably of the entire drive 1, is detected via one or more of the temperature sensors listed above. In addition, it is possible to verify the detected values via a temperature model or to determine the temperature of drive components which are not provided directly with sensors, via predetermined algorithms stored in the regulating unit and/or a cloud (for example, via a digital twin).

In this way, energy-efficient operation of the drive 1 can be carried out and maintenance intervals of the drive 1 and its components can also be better planned, such as, for example, relubrication intervals of the bearings.

In this case, the sensors are vibration sensors, temperature sensors, humidity sensors, etc. Advantageously, the sensors transmit their data to the regulating unit via a line or via wireless connections. The data is gathered either through direct contact or optically (for example, infrared temperature measurement).

The regulating units of different drives 1 can also be in contact via a cloud and thereby exchange predeterminable data of their drives.

This results in a highly compact and efficient drive 1 which, due to the regulating unit, ensures thermal and/or energy-efficient operation of the drive 1. In this case, the regulating unit intervenes in the clock frequency, the degree of control and/or the control angle of an inverter of the electronic add-on part, as well as, for example, in the rotational speed of an external fan. This results in optimum and controllable distribution of losses between the components of the dynamoelectric machine 2 and the electronic add-on parts 13 with regard to thermal limits and/or energy efficiency of the drive 1.

Thermally controllable or adjustable optimum operation of the drive 1 is thus also ensured by means of the cooling units, at least one base cooling unit, one self-ventilation unit 15 and/or one booster cooling unit, which in particular cools the components of the dynamoelectric rotary machine 2, such as the stator and the rotor, as well as the electronic add-on parts 13, such as service and control electronics, the regulating unit, etc.

For example, certain settings of the clock frequency of the inverter lead to lower losses in the inverter but increase the losses in the dynamoelectric machine 2. Conversely, thermally favorable settings for the dynamoelectric machine 2 can place greater thermal stress on the inverter. Depending on which of these subsystems of the drive 1 still has thermal reserves, the inverter can be adjusted accordingly via the regulating unit. In addition, the regulating unit can also intervene in the cooling in that, for example, one or more external fans of the drive 1 are switched on or off or are operated at the corresponding rotational speed.

The invention claimed is:
1. A method of producing an add-on part of a drive, said method comprising:
    providing one circuit board of multiple planar circuit boards, which have electrical conductor tracks with electrical connections, with a centrally arranged opening for passage of a shaft;
    populating the circuit boards with electrical and/or electronic components;
    electrically testing the populated electrical and/or electronic components and wiring;
    arranging segments made of a material with high thermal conductivity on at least two of the multiple circuit boards such that a bending process in a region of the electrical connections between the at least two circuit boards causes the segments to form an approximately peripherally closed cover; and
    arranging lids on open sides of the cover to realize a closed housing arrangement.

2. The method of claim 1, further comprising arranging the circuit boards in a star-shaped manner such that a central one of the circuit boards is surrounded by peripheral ones of the circuit boards.

3. The method of claim 2, further comprising electrically conductively connecting the peripheral circuit boards to the central circuit board.

4. The method of claim 3, wherein the electrically conductive connection is designed as a rigid-flex connection.

5. The method of claim 1, further comprising providing radial and/or axial connection options in the cover.

6. The method of claim 1, further comprising mechanically connecting the segments to one another by connectors.

7. The method of claim 1, further comprising providing radial and/or axial connection options in a segment of the circuit boards and/or a lid attached to the segment.

8. An add-on part of a drive, said add-on part comprising:
    multiple circuit boards having arranged thereon actuator or inverter components and arranged in a star-shaped manner such that a central one of the circuit boards is surrounded by peripheral ones of the circuit boards, with the peripheral circuit boards being electrically conductively connected to the central circuit board, said central circuit board having a central opening for passage of a shaft, at least one of the peripheral circuit boards being bent at a predetermined angle with respect to the central circuit board on a bending section; and
    a peripheral cover composed of at least two segments which are made of a material with high thermal conductivity, each of the at least two segments being In direct thermally conductive contact with at least one of the peripheral circuit boards.

9. The add-on part of claim 8, wherein an electrically conductive connection between the peripheral circuit boards and the central circuit board is a rigid-flex connection.

10. The add-on part of claim 8, further comprising essentially axial cooling fins provided on the peripheral cover.

11. The add-on part of claim 10, wherein the essentially axial cooling fins are provided on a radially outer boundary of the peripheral cover.

12. A drive, comprising:
    a dynamoelectric rotary machine including a shaft;
    an add-on part comprising multiple circuit boards having arranged thereon actuator or inverter components and arranged in a star-shaped manner such that a central one of the circuit boards is surrounded by peripheral ones of the circuit boards, with the peripheral circuit boards being electrically conductively connected to the central circuit board, said central circuit board having a central opening for passage of the shaft, at least one of the peripheral circuit boards being bent at a predetermined angle with respect to the central circuit board on a bending section, and a peripheral cover composed of at least two segments which are made of a material with high thermal conductivity, each of the at least two segments being in direct thermally conductive contact with at least one of the peripheral circuit boards;

a cooling unit generating a cooling air flow for cooling the add-on part and the dynamoelectric rotary machine, wherein the dynamoelectric rotary machine, the add-on part and the cooling unit are arranged axially one behind the other such that the add-on part is arranged axially between the dynamoelectric rotary machine and the cooling unit.

13. The drive of claim 12, wherein the dynamoelectric rotary machine includes a housing, said cover including cooling fins in alignment with cooling fins of the housing.

14. The drive of claim 13, further comprising a fan cowl forming a guide device for the cooling air flow and extending up to approx. 30% over an axial length of the housing of the dynamoelectric rotary machine.

15. The drive of claim 12, wherein the cooling unit is designed as a fan unit which generates the cooling air flow at least in a section via the cover and the dynamoelectric rotary machine during operation of the dynamoelectric rotary machine.

16. The drive of claim 12, wherein the cover includes a lid, the lid and the add-on part having a recess in a region of the shaft to enable self-ventilation of the drive.

* * * * *